United States Patent [19]

Deguchi

[11] Patent Number: 5,006,192
[45] Date of Patent: Apr. 9, 1991

[54] APPARATUS FOR PRODUCING SEMICONDUCTOR DEVICES

[75] Inventor: Mikio Deguchi, Itami, Japan

[73] Assignee: Mitsubishi Denki Kabushiki Kaisha, Japan

[21] Appl. No.: 273,556

[22] Filed: Nov. 21, 1988

[30] Foreign Application Priority Data

Jun. 28, 1988 [JP] Japan .................................. 63-158062

[51] Int. Cl.[5] ..................... H01L 21/304; C23C 14/00
[52] U.S. Cl. .................................... 156/345; 156/643;
204/298.06; 204/298.34; 118/715; 118/723;
134/1
[58] Field of Search ...................... 204/298.34, 298.06;
156/345, 643; 118/624, 625, 723, 50.1, 715;
427/38, 39; 134/1

[56] References Cited

U.S. PATENT DOCUMENTS

| | | | |
|---|---|---|---|
| 4,134,817 | 1/1979 | Bourdon | 204/298.34 |
| 4,352,725 | 10/1982 | Tsukada | 204/298.34 |
| 4,464,223 | 8/1984 | Gorin | 204/298.34 |
| 4,512,283 | 4/1985 | Bonifield et al. | 156/345 |
| 4,585,516 | 4/1986 | Corn et al. | 204/298.34 |
| 4,767,641 | 9/1988 | Kieser et al. | 156/345 |
| 4,786,392 | 11/1988 | Kruchowski | 204/298.34 |

FOREIGN PATENT DOCUMENTS

| | | | |
|---|---|---|---|
| 0034706 | 9/1981 | European Pat. Off. | 156/345 |
| 62-2619 | 1/1987 | Japan | 156/345 |
| 62-18030 | 1/1987 | Japan | 156/345 |
| 63-221620 | 9/1988 | Japan | 156/345 |
| 0111872 | 4/1989 | Japan | 204/298.06 |

OTHER PUBLICATIONS

Waelbroeck et al., "Cleaning and Conditioning of the Walls of Plasma Devices by Glow Discharges in Hydrogen", J. Vac. Sci. Technol., vol. 2, No. 4, Oct., Dec. 1984.

Noda et al., "Study of the Discharge Cleaning Process in JIPP T-11 Torus by Residual Gas Analyzer", J. Vac. Sci. Technol. A 1(3), Jul.-Sep. 1983.

Primary Examiner—Kenneth M. Schor
Assistant Examiner—Todd J. Burns
Attorney, Agent, or Firm—Leydig, Voit & Mayer

[57] ABSTRACT

An apparatus for treating wafers utilizing the plasma produced by a gas discharge and a method of cleaning such apparatus are disclosed. The apparatus is equipped with a device for forming a high voltage electric field in a space outside of the discharge space in which the wafer treating plasma is generated. The cleaning of the inner surfaces of the vacuum vessel of the apparatus is effected during the periods between the treatments by means of the plasma generated by the gas discharge started and sustained by the electric field device as well as by a main electrode for maintaining the treating discharge. The device for forming a high voltage electric field as mentioned above may comprise a limiter electrode surrounding the treating discharge space; alternatively, it may comprise an auxiliary electrode disposed in the space outside the treating discharge space. First, an etching gas capable of etching the films deposited on the inner surfaces of the vessel of the apparatus is introduced into the vessel as the discharge gas in the cleaning process; next, hydrogen is introduced into the vessel to remove the impurities adsorbed on the surfaces of the vessel. The etching gas may comprise hydrogen or argon.

7 Claims, 2 Drawing Sheets

APPARATUS FOR PRODUCING SEMICONDUCTOR DEVICES

BACKGROUND OF THE INVENTION

1. Field of the Invention

This invention relates to apparatuses for treating wafers utilizing the plasmas produced by gas discharges; this invention also relates to methods of cleaning such apparatus.

2. Description of the Related Art

FIG. 1 is a schematic view of a conventional plasma chemical vapor deposition apparatus. The apparatus of the figure comprises the grounded vacuum vessel 1 in which the wafer or the substrate 2 is placed. The high frequency voltage applying main electrode 3, electrically connected to the high frequency voltage source 4, opposes the substrate 2 from above across a discharge space 5. The outer surfaces of the electrode 3 are covered by the grounding shield 6 electrically connected to the vessel 1. Further, limiter electrode 7, electrically connected to the vessel, surrounds the sides of the discharging space in which plasma 5a is formed. A heater 8 is provided to heat the substrate 2 to a predetermined temperature.

The operation of the apparatus of FIG. 1 is as follows. After the substrate 2 is heated to a predetermined temperature by the heater 8, the deposition gas for forming thin films on the substrate 2 is introduced into the vessel 1 through an inlet port (not shown); a carrier gas may also be introduced into the vessel 1, if necessary. When amorphous silicon films are formed on the substrate 2, for example, silane gas ($SiH_4$) may be used as the material gas for forming the thin films on the substrate 2, and hydrogen gas ($H_2$) or the argon gas (Ar) as the carrier gas. Further, a high voltage is applied to the main electrode 3 by the voltage source 4 to start a glow gas discharge in the discharge space 5 between the electrode 3 and the substrate 2, thereby generating a plasma therein. The plasma 5a produced therein is that of the deposition gas and the carrier gas introduced into the vessel 1. The molecules of the deposition gas are decomposed by the impacts of the electrons in the plasma 5a, and a desired thin film is formed on the substrate through a series of chemical reactions.

In this process of thin film formation utilizing the plasma 5a produced by the gas discharge, the limiter electrode 7 which is electrically connected to the vessel 1 is kept at the ground voltage. Thus, the discharge space 5 is limited to the regions surrounded by the electrode 3, the substrate 2, and the limiter electrode 7; thus, the plasma 5a is prevented from coming into direct contact with the inner surfaces of the walls of the vessel 1.

The conventional apparatus as described above, however, has the following disadvantages.

The limitation of the discharge space 5 by the limiter electrode 7 cannot prevent the diffusion of the particles formed by the decomposition of the deposition gas in the plasma 5a. Thus, these decomposed materials are diffused over the whole space in the vessel 1, thereby forming films of the material on the surfaces of the vessel 1 which are situated outside the discharging space 5 contained by the limiter electrode 7; although the speed of the accumulation of the film on the surfaces outside of the discharge space 5 is slow compared with that of the deposition of the film on the substrate 2, the films accumulated on the surfaces of the vessel 1 may peel therefrom and drop onto the surface of the substrate 2 which are undergoing the film formation process, which results in defects in the films on the substrate 2.

The limitation of the discharge space 5 by the limiter electrode 7 reduces the percentage of the volume occupied by the plasma 5a in the whole volume of the vessel 1. This is disadvantageous for the purpose of reducing the amount of impurities such as oxygen (O) and carbon (C) which remain near the surface regions of the walls of the vessel 1 and which have adverse effects on the quality of the film formed on the substrate 2.

SUMMARY OF THE INVENTION

Thus, an object of the present invention is to provide an apparatus for treating wafers or substrates of the above mentioned type which is equipped with an in situ cleaning means for cleaning the films deposited on the surfaces of the apparatus and the impurities adsorbed thereby.

A further object of the present invention is to provide a method of cleaning such an apparatus for treating substrates, wherein the apparatus can be cleaned of the films deposited on the surfaces thereof and the impurities adsorbed thereby.

According to the present invention, an apparatus for treating wafers utilizing a plasma produced by a gas discharge is provided; the apparatus comprises the following members: a vacuum vessel; a main electrode and an opposing electrode which are disposed in the vessel and a supporting means for the wafer or the substrate. The main electrode is electrically connected to a high voltage source to form a high voltage electrical field between the main electrode and the opposing electrode. The means for supporting the substrate is on the opposing electrode and/or the main electrode; means for introducing a gas into the vessel; and means for forming a high voltage electrical field which forms a high voltage electrical field outside of the discharge space between the main electrode and the means for supporting the substrate.

According to the method of cleaning such an apparatus for treating wafers of the present invention, the vessel and the portions of the apparatus disposed therein are cleaned of the films deposited thereon during the treatment process of the wafers and also of the impurities adsorbed thereby; the method according to the present invention comprises introducing a discharge gas in the vacuum vessel and forming a high voltage electrical field in a space comprising the discharge space between the main electrode and the opposing electrode and the space lying outside thereof. The discharge gas introduced into the vessel may comprise an etching gas the plasma of which is capable of etching the films deposited on the surfaces of the vessel and the portions of the apparatus disposed therein; examples of such etching gas includes hydrogen gas and argon gas. Hydrogen gas may be introduced into the vessel subsequent to the introduction of the etching gas to clean and remove the impurities remaining in the near surface region of the inner walls of the vessel and the portions of the apparatus disposed therein: the plasma of the hydrogen gas is capable of removing impurities such as oxygen (O) and carbon (C). The cleaning process according to the present invention is performed in a period between the treatment processes—such as thin film formation or sputtering or etching—of the apparatus.

BRIEF DESCRIPTION OF THE DRAWINGS

Further features and details of the present invention will become more clear in the following detailed description of the preferred embodiments, taken in conjunction with the attached drawings, in which:

FIGS. 2a and 2b are views similar to that of FIG. 1, but showing an apparatus equipped with an in situ cleaning means according to the present invention, wherein FIG. 2a shows the apparatus in the thin film formation process, and FIG. 2b shows the apparatus in the cleaning process according to the present invention.

In the drawings, like reference numerals represent like or corresponding members or parts.

DESCRIPTION OF THE PREFERRED EMBODIMENTS

Figure 1:
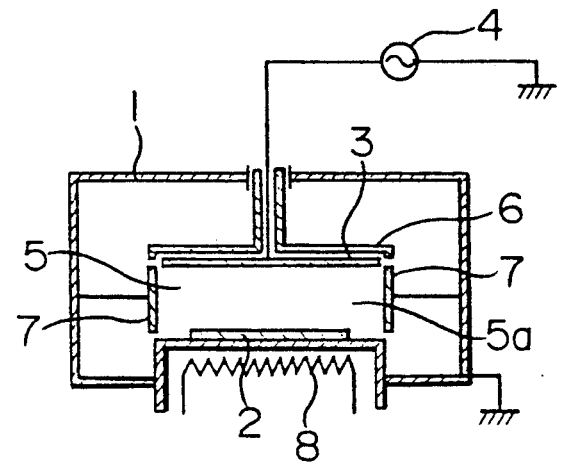
FIG. 1 is a schematic sectional view of a conventional plasma chemical vapor deposition apparatus for forming thin films on wafers or substrates.
Figure 2A:
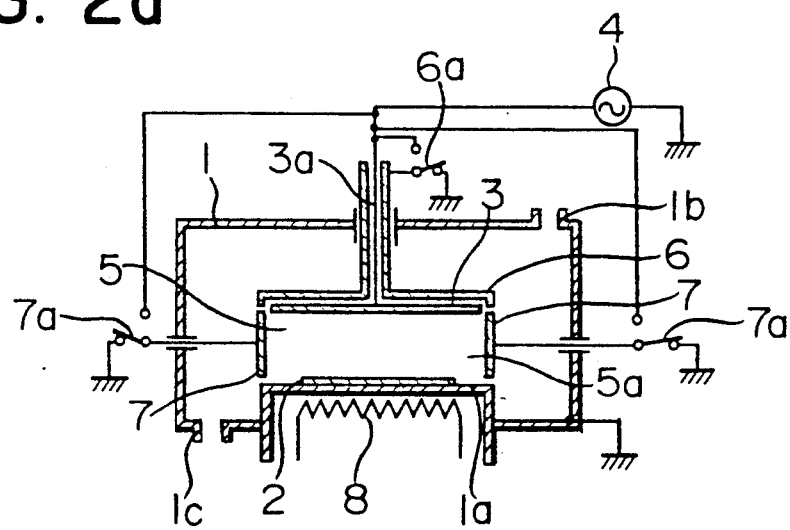
Figure 2B:
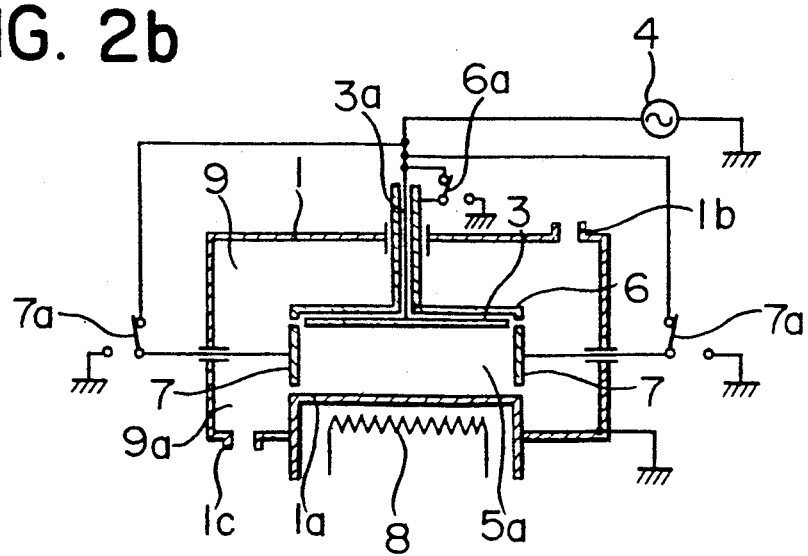

Referring now to FIGS. 2a and 2b of the drawings, a first embodiment of the present invention is described. The apparatus shown in these figures is a plasma chemical vapor deposition apparatus similar to that shown in FIG. 1.

Substantially hollow cylindrical vacuum vessel 1 comprises a table 1a for supporting a wafer or substrate 2, such as a semiconductor wafer, a glass or a stainless substrate at the bottom portion of the vessel 1, and an inlet port 1b and an outlet port 1c for introducing and exhausting discharge or carrier gases. The vessel 1 may be stainless steel and have a diameter of 300 mm and a height of 300 mm. A main electrode 3 electrically connected to a high voltage source 4 supplying a voltage at a frequency of 13.56 MHz is disposed in the vessel 1 above the table 1a at a distance of 40 mm. The surfaces of the main electrode 3 and the wire 3a connecting the electrode 3 to the voltage source 4, which do not oppose the discharge space 5 between the electrode 3 and the table 1a, are covered by the shield 6 which is grounded by means of the switch 6a during the substrate treatment process, i.e., the thin film formation. Further, the discharge space 5 between the main electrode 3 and the table 1a is surrounded by the limiter electrode 7 on all sides to confine the gas discharge within the discharge space 5. The shield 6 and the limiter electrode 7 are also made of stainless steel, and are capable of being electrically connected to the ground (FIG. 2a) and to the voltage source 4 (FIG. 2b) through the switches 6a and 7a, respectively; the shield 6 and the limiter electrode 7 are electrically insulated from the vessel 1. The table 1a and the main electrode 3 may have the form of a disk with a diameter of 120 mm, and the limiter electrode 7 may have the form of a hollow cylinder of substantially the same diameter. A heater 8 is disposed under the table 1a for heating the substrate 2 to a predetermined temperature during the thin film formation thereon.

During the substrate treatment process, in which a thin film of amorphous silicon, for example, is formed on the surface of the substrate 2, the shield 6 and the limiter electrode 7 are grounded by means of the switches 6a and 7a as shown in FIG. 2a; thus, the process is substantially similar to that of the conventional apparatus of FIG. 1. Therefore, the details thereof are omitted herein.

As the substrate treatment process proceeds, thin films of the decomposed material from the deposition gas such as silane ($SiH_4$) gradually accumulate on the surfaces of the vessel 1 and the portions of the apparatus disposed therein; the accumulation of the films occurs not only on the surfaces directly facing the discharge space 5, but also on surfaces outside of the discharge space 5, because the decomposed material formed in the discharge space 5 diffuse over the whole volume of the vessel 1.

On the other hand, during the periods between the substrate treatment processes, the shield 6 and the limiter electrode 7 are electrically connected to the high voltage source 4 by means of the switches 6a and 7a, respectively, as shown in FIG. 2b. Thus, a high voltage electrical field is formed between the grounded vessel 1 and the table 1a forming part thereof, and the main electrode 3, the shield 6, and the limiter electrode 7 which are electrically connected to the high voltage source 4. With the introduction of a discharge gas into the vessel 1 through the inlet port 1b, plasma 5a and 9a is formed not only in the discharge space 5 between the main electrode 3 and the table 1a, but also in the space 9 lying outside of the discharge space 5 by the glow discharge caused by the high voltage electric field formed therein. Thus, the plasma 5a and 9a occupies substantially the whole volume inside the vacuum vessel 1.

The discharge gas, which is introduced into the vessel through the inlet port 1b and exhausted therefrom through the outlet port 1c at a predetermined flow rate, may comprise an etching gas and hydrogen gas as described in what follows.

First, an etching gas, the plasma of which is capable of etching the films deposited and accumulated on the inner surfaces of the vessel 1, etc., during the substrate treatment process, is introduced into the vessel 1 to etch and remove such films. The etching may be performed either by the reactive etching process utilizing chemical reactions or by the non-reactive etching process. However, an etching gas is preferred which has no adverse effects on the substrate treatment process even if the gas remains in the vessel 1 as a remnant impurity. By the introduction of the etching gas into the vessel 1, plasma 5a and 9a occupy substantially in the whole volume of the vessel 1 as shown in FIG. 2b, thereby removing the films accumulated on the inner surfaces of the vessel 1. Thus, the cleaning of the accumulated films can be effected easily without complicated operations such as the disassembly of the vessel 1.

Further to the etching process as described above, hydrogen gas is introduced into the vessel 1 to form a plasma in the whole volume of the vessel 1, thereby removing the remnant impurities such as carbon (C) and oxygen (O) adsorbed on the inner surfaces of the vessel 1. The carbon and oxygen are released and exhausted in the form of carbon monoxide, hydrocarbons, and water, etc. By this process of discharge cleaning utilizing the hydrogen plasma, the amount of the impurities left in the vessel 1 can be minimized and the adverse effects of the impurities due to the mixing thereof in the films on the substrate 2 during the film formation process can be avoided. The parameters of this impurities removing process may be as follows:

| | |
|---|---|
| hydrogen gas pressure: | 0.1 Torr |
| hydrogen gas flow rate: | 0.1 liters/second |
| discharge power: | 100W |

In the case of the apparatus of FIGS. 2a and 2b, plasma is not generated in the gaps between the shield 6 and the main electrode 3 during the cleaning process shown in FIG. 2b, because the shield 6 and the main electrode 3 are both electrically connected to the voltage source 4 and are at the same voltage level. However, it is possible to generate a plasma in such gaps by grounding the shield 6 and increasing the pressure of the discharge gas, the main electrode 3 being still electrically connected to the voltage source 4. Further, although the frequency of the voltage source 4 is in the high frequency (HF) region in the embodiment described above, the frequency of the voltage source 4 is not limited thereto; the gas discharge utilized in the cleaning process according to the present invention may be a D.C. discharge, and the discharge may be a continuous discharge, or a pulsed discharge.

In the embodiment of FIGS. 2a and 2b, the plasma 9a is generated in the space 9, lying outside of the discharge space 5 for the substrate treatment by a high voltage electric field, by the application of a high voltage to the limiter electrode 7 and the shield 6, i.e., the voltage source 4. In the second embodiment according to the present invention shown in FIGS. 3a and 3b, however, auxiliary electrodes 10 having a L-shaped cross sectional form are disposed in the space 9 outside of the substrate treating discharge space 5 for the purpose of forming a high voltage electric field therein. The auxiliary electrodes 10 are made of stainless steel and are capable of being switched to be electrically connected to ground (FIG. 3a) and to the voltage source 4 by means of the switches 10a (FIG. 3b). The embodiment of FIGS. 3a and 3b is also a chemical vapor deposition apparatus utilizing a plasma produced by a gas discharge to form thin films on substrates, and except for the auxiliary electrodes 10, the apparatus of FIGS. 3a and 3b has a structure similar to that of the apparatus of FIG. 1.

Figure 3A:
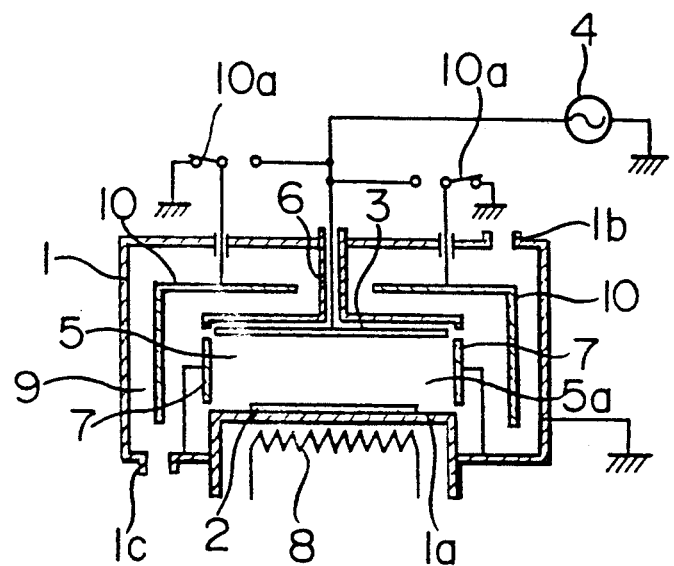
FIGS. 3a and 3b are views similar to those of FIGS. 2a and 2b, respectively, but showing another apparatus equipped with an in situ cleaning means according to the present invention.
Figure 3B:
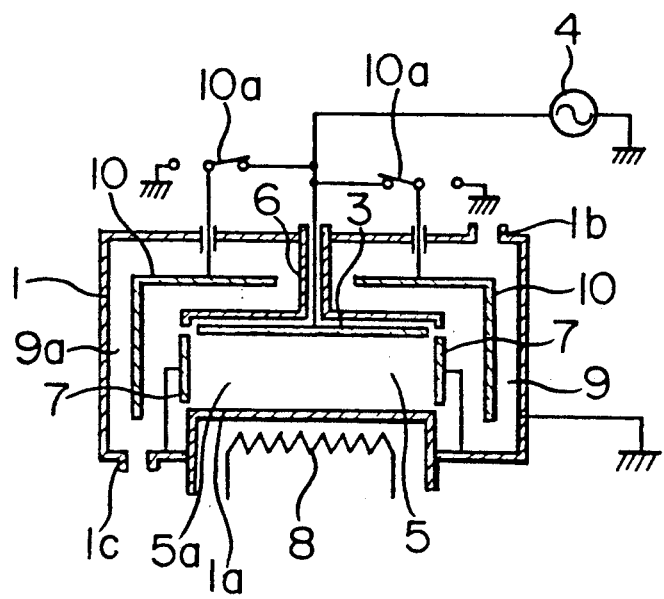

During the process of thin film formation on the substrate 2, the auxiliary electrodes 10 are grounded through the switches 10a as shown in FIG. 3a, and the operation of the apparatus during the process is similar to that of the conventional apparatus of FIG. 1. On the other hand, during the periods between the substrate treatment processes, the auxiliary electrodes 10a are electrically connected to the high voltage source 4 by means of the switches 10a as shown in FIG. 3b; the shield 6 and the limiter electrode 7, however, are electrically connected to the grounded vessel 1. Thus, a high voltage electric field is formed not only in the discharge space 5 for the substrate treatment between the main electrode 3 and the table 1a, but also in the space 9 lying outside of the space 5 between the auxiliary electrodes 10 and the vessel 1, between the electrodes 10 and the shield 6, and between the electrodes 10 and the limiter electrode 7. The plasma 5a and 9a is formed in the space 9 as well as in the space 5 with the introduction of a discharge gas into the vessel 1 through the inlet port 1b.

Otherwise, the structure and the operation of the embodiment of FIGS. 3a and 3b are similar to those of the embodiment of FIGS. 2a and 2b, and the explanation thereof is omitted herein.

In the embodiments of the present invention described above, a high voltage source in the high frequency region is used to form a high voltage electric field in the space 5 and 9 in the vessel 1. However, a microwave generator, i.e., a magnetron, and a waveguide system may also be used to form such an electric field in the vessel 1. Further, the embodiments described above have been limited to the apparatus for effecting thin film formation by the chemical vapor deposition utilizing the plasma produced by a gas discharge. However, the present invention is applicable to other treating apparatus, such as etching or sputtering apparatus, which utilize a plasma produced by the gas discharge. Further, in the embodiments described above, a wafer or a substrate is supported on the grounded table opposing the main electrode. However, a wafer or a substrate may be supported on the opposing surface of the main electrode.

What is claimed is:

1. An apparatus for treating wafers utilizing a plasma produced by a gas discharge comprising:
    an electrically conductive, grounded vacuum vessel;
    a main electrode, an opposing electrode, means for supporting a wafer, said means for supporting a wafer being disposed on one of said main and opposing electrodes, and a limiter electrode disposed between said main and opposing electrodes, said main, opposing, and limiter electrodes being disposed within said vacuum vessel and generally enclosing a first discharge space and defining a second discharge space outside the first discharge space within said vacuum vessel;
    means for introducing a gas into said vacuum vessel;
    a high voltage source having a high voltage terminal and a ground terminal for forming a high voltage electrical field in the first discharge space and generating a plasma in the first discharge space in a gas introduced into said vacuum vessel, one of said main and opposing electrodes being electrically connected to said high voltage terminal and the other of said main and opposing electrodes being electrically connected to said ground terminal; and
    means for selectively alternatively electrically connecting said limiter electrode to said ground terminal for generating the plasma in the first discharge space and to said high voltage terminal for generating a plasma in the first and second discharge spaces.

2. An apparatus for treating wafers as claimed in claim 1 comprising:
    an electrical shield disposed adjacent said main electrode outside of the first discharge space; and
    means for alternatively electrically connecting said electrical shield to said high voltage and ground terminals.

3. An apparatus for treating wafers as claimed in claim 1 wherein said high voltage source comprises a high frequency electrical signal generator.

4. An apparatus for treating wafers as claimed in claim 3 wherein said high frequency electrical signal generator produces an electrical field at a frequency of 13.56 MHz.

5. An apparatus for treating wafers as claimed in claim 1 wherein said high voltage source comprises a D.C. electrical field signal generator.

6. An apparatus for treating wafers as claimed in claim 1 wherein said high voltage source comprises a microwave signal generator.

7. An apparatus for treating wafers utilizing a plasma produced by a gas discharge comprising:

an electrically conductive, grounded vacuum vessel;

a main electrode, an opposing electrode, means for supporting a wafer, said means for supporting a wafer being disposed on one of said main and opposing electrodes, and a grounded limiter electrode disposed between said main and opposing electrodes, said main, opposing, and limiter electrodes being disposed within said vacuum vessel and generally enclosing a first discharge space;

means for introducing a gas into said vacuum vessel;

a high voltage source having a high voltage terminal and a ground terminal for forming a high voltage electrical field in the first discharge space and generating a plasma in the first discharge space in a gas introduced into said vacuum vessel, one of said main and opposing electrodes being electrically connected to said high voltage terminal and the other of said main and opposing electrodes being electrically connected to said ground terminal;

an auxiliary electrode disposed in said vacuum vessel outside the first discharge space and defining a second discharge space between said auxiliary electrode and said vacuum vessel; and means for selectively alternatively electrically connecting said auxiliary electrode to said ground terminal for generating the plasma in the first discharge space and to said high voltage terminal for generating a plasma in the first and second discharge spaces.

* * * * *